United States Patent [19]
Hara et al.

[11] Patent Number: 5,708,343
[45] Date of Patent: Jan. 13, 1998

[54] CONTROL DEVICE FOR DIRECT CURRENT ELECTRIC MOTOR

[75] Inventors: Nobuo Hara; Hiroaki Ogata; Masaya Suenari, all of Iwata, Japan

[73] Assignee: Yamaha Hatsudoki Kabushiki Kaisha, Iwata, Japan

[21] Appl. No.: 702,620

[22] PCT Filed: Dec. 25, 1995

[86] PCT No.: PCT/JP95/02651

§ 371 Date: Oct. 29, 1996

§ 102(e) Date: Oct. 29, 1996

[87] PCT Pub. No.: WO96/20529

PCT Pub. Date: Jul. 4, 1996

[30] Foreign Application Priority Data

Dec. 28, 1994 [JP] Japan ................. 6-328419
Feb. 28, 1995 [JP] Japan ................. 7-040478

[51] Int. Cl.$^6$ ............................ H02P 7/06; H02P 3/08
[52] U.S. Cl. ........................ 318/599; 318/139; 318/254; 318/269; 388/806
[58] Field of Search ............................ 318/138, 139, 318/245, 269, 254, 599, 600, 603, 493; 388/800–809; 180/179, 206; 323/282, 285

[56] References Cited

U.S. PATENT DOCUMENTS

| | | |
|---|---|---|
| 3,911,342 | 10/1975 | Herwig ................. 318/373 |
| 4,521,725 | 6/1985 | Phaneuf ................. 323/282 |
| 5,039,924 | 8/1991 | Avitan ................. 318/139 |
| 5,070,283 | 12/1991 | Avitan ................. 318/139 |
| 5,155,797 | 10/1992 | Nomura et al. ................. 388/815 |
| 5,453,672 | 9/1995 | Avitan ................. 318/493 |
| 5,565,760 | 10/1996 | Ball et al. ................. 322/23 |
| 5,585,706 | 12/1996 | Avitan ................. 318/493 |
| 5,602,448 | 2/1997 | Yaguchi ................. 318/139 |
| 5,603,388 | 2/1997 | Yaguchi ................. 180/206 |
| 5,629,610 | 5/1997 | Pedrazzini et al. ................. 323/283 |

*Primary Examiner*—Paul Ip
*Attorney, Agent, or Firm*—Knobbe, Martens, Olson & Bear LLP

[57] ABSTRACT

A device includes an FET 206 interposed between one end of a motor 201 and a positive electrode of a battery EB; a diode 203 for circulating an electric current so as to flow through the motor 201 after the switching means is turned off, the electric current is the same as that which has flown through the motor 201 before the switch 220 is turned off; a shunt 203a, differential amplifier 203b, and a low-pass filter 203c as means for detecting a value of an electric current flowing to the motor 210; and a controller 250 for turning on and off the switching means by the PWM control, so that the value of the electric current detected by the current detection means coincides with a target value. The controller 250 sets a very small value as the target value when the motor is rotated by inertia thereof, and supplying the electric current of the small target value to the motor 201. As a result, it is possible to protect the FET for actuating the motor in an auxiliary motor-equipped bicycle without addition of structural elements at a low cost.

4 Claims, 7 Drawing Sheets

CONTROL DEVICE FOR DIRECT CURRENT ELECTRIC MOTOR

TECHNICAL FIELD

The present invention relates to a control device for a direct current electric motor suited to be used for PWM control of a direct current electric motor such as an auxiliary motor for driving a bicycle.

BACKGROUND ART

A bicycle provided with an auxiliary motor has been known. In this kind of bicycle, treading force on the pedals is detected, and an auxiliary which is suitable to the treading force is generated by the motor, so that the wheels are driven by a resultant force of the auxiliary torque and the treading force. In order that the rider comfortably pedal, the auxiliary torque supplementing to the treading force to the pedals should be exactly generated.

Usually, the auxiliary torque is adjusted by a PWM (pulse width modulation) control to the electric current supplied to the motor. In this case, a control signal is supplied to a switching element, for example, a gate of an FET, whereby a pulse current, having a duty factor calculated by a control unit such as a micro computer, is provided to the motor. A relay is interposed between the FET and the motor for stopping the drive system when the main switch is turned off or when the FET is broken.

In the auxiliary motor-equipped bicycle, the rate of the auxiliary torque to the pedaling torque is controlled to be gradually reduced according to the velocity of the bicycle when the velocity is above a first threshold velocity Vth1 (for example, 23 km/h). Also, the ratio is controlled to be zero above a second threshold velocity Vth2 (for example, 26 km/h). For this purpose, when the velocity is increased to the first threshold velocity Vth1 or higher, the duty factor of the pulse for the PWM control is gradually reduced according to the excess of the velocity, and when the velocity reaches the second threshold velocity Vth2 or higher, the duty factor becomes zero, so that no auxiliary torque is generated by the motor. In other words, the PWM control for the motor is interrupted.

As the above-mentioned relay, a normally open type relay is used. After the main switch of a circuit is turned off, the current supply to the exciting coil of the normally open type relay is stopped, whereby the normally open type relay breaks the circuit. After the main switch is turned off, when the circuit voltage is lowered to be a certain value, the contact points of the relay are separated from each other. Until the contact points of the relay is separated, an induced voltage of the motor is applied backward between the gate and the source of the FET, so as to cause a failure of the FET.

As described above, when the velocity reaches the second threshold velocity Vth2, the auxiliary torque is controlled to be zero. Then, the duty factor of the current supplied to the motor becomes zero, and the FET is maintained to be off. However, although the current supply to the motor is stopped, the motor does not stop to revolve immediately because of the inertia, so as to generate electric energy. Consequently, an induced voltage is generated between the terminals of the motor, so as to cause a failure of the FET as in the above-mentioned case.

Therefore, some countermeasures are needed: for example, a sort of FET, of which the rated voltage between the gate and the source is high, is employed. Alternatively, a Zener diode is interposed between the gate and the source, so that the uppermost limit of the voltage between the gate and the source is restricted.

However, Zener diodes and FETs, which can be used under high voltage, are usually expensive. Therefore, the production cost is extremely increased. In order to lower the cost, it is necessary to protect the FET by countermeasures other than the above.

DISCLOSURE OF INVENTION

It is, therefore, an object of the invention to propose a control device for a direct current electric motor, by which when the main switch is accidentally turned off or the like, a switching element such as an FET can be protected without increasing the production cost.

In order to resolve the above problems, according to the invention as defined in claim 1, there is provided a control device for a direct current electric motor comprising:

switching means interposed between a direct current electric motor and an electric power source therefor;

circulation means for circulating an electric current so as to flow through the motor after the switching means is turned off, the electric current is the same as that which has flown through the motor before the switching means is turned on;

current detection means for detecting a value of the electric current flowing to the motor; and controlling means for turning on and off the switching means by the PWM control, so that the value of the electric current detected by the current detection means coincides with a target value, the controlling means setting a very small value as the target value when the motor is rotated by inertia thereof, and supplying the electric current of the small target value to the motor.

According to the invention as defined in claim 2, the controlling means sets a vary small value as the target value when a switch of the power supply is turned off, and supplies the electric current of the small target value to the motor.

According to the invention as defined in claim 3, the controlling means sets a very small value as the target value before setting the target value zero, and supplies the electric current of the very small value to the motor.

According to the invention as defined in claim 4, the controlling means sets the very small value to zero after passage of a predetermined time from the time when the supply of the electric current of the very small value is started.

BRIEF DESCRIPTION OF DRAWINGS

FIGS. 6 (A), 6 (B), and 6 (C) are graphs showing properties of target-current-value-calculation means according to the third embodiment.

BEST MODE FOR CARRYING OUT THE INVENTION

A. First Embodiment

A-1. Construction of First Embodiment

Figure 1:
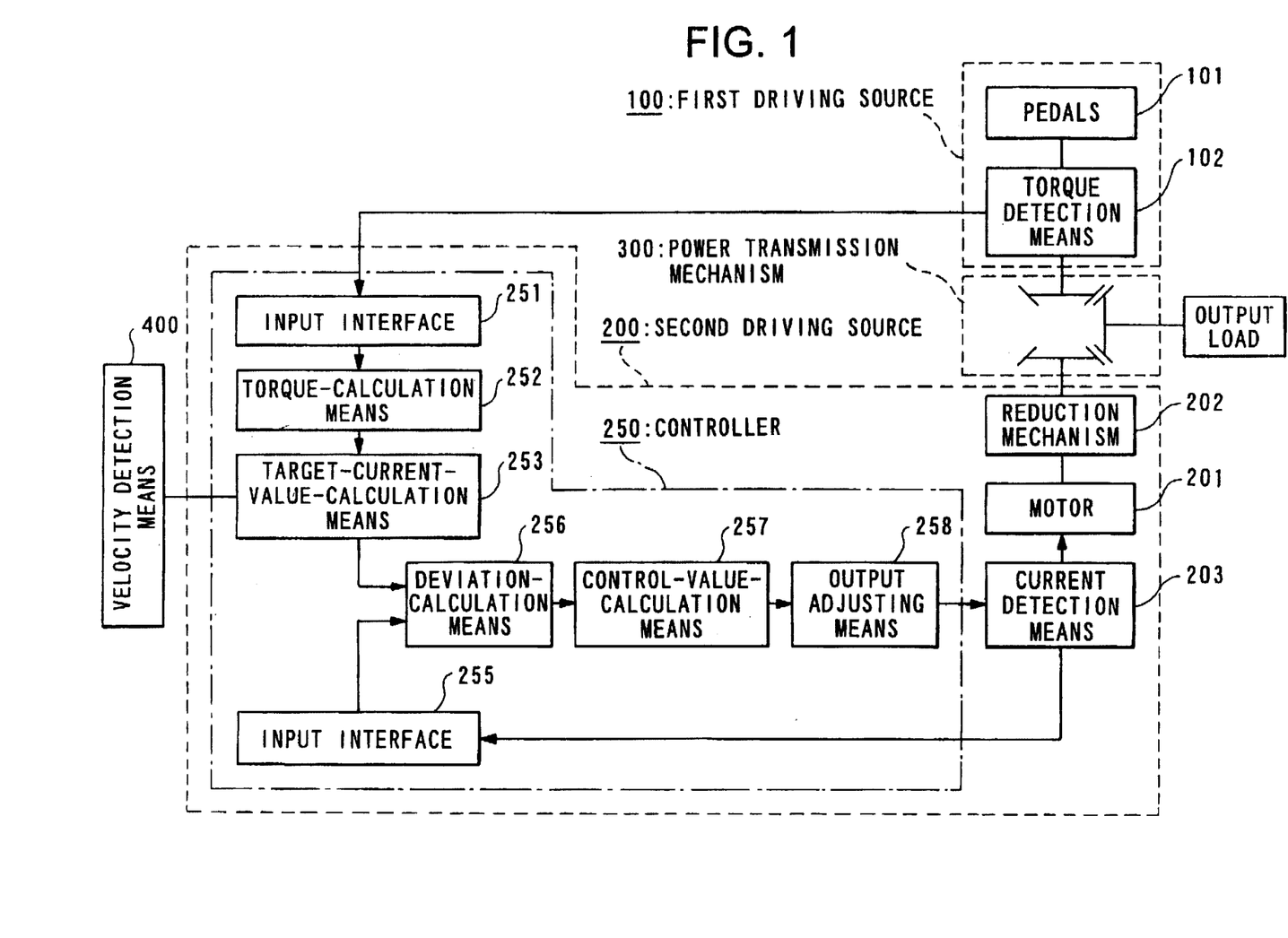
FIG. 1 is a block diagram showing a construction of an auxiliary motor-equipped bicycle to which a first embodiment of the present invention is applied.

One embodiment of the present invention will be described hereinafter with reference to FIGS. 1 through 3. FIG. 1 is a block diagram showing a drive system of an auxiliary motor-equipped bicycle in which a control unit for a DC motor according to one embodiment of the present invention is employed. As shown in FIG. 1, this drive system generally comprises the first drive power supply 100 for generating a torque caused by pedaling force of human power; the second drive power supply 200 for generating an auxiliary torque caused by electric power; and a power transmission mechanism 300 for combining the torque generated by the first drive supply with the torque by the second drive power supply, and for transmitting the resulting torque to the rear wheel of the bicycle.

The first drive power supply 100 includes a pair of pedals 101 for receiving the rider's pedaling force; and a torque detection means 102 for detecting the torque to be supplied to the power transmission mechanism 300 by the pedals 101. The second drive power supply 200 includes a motor 201 for generating a torque according to an electric power supplied from a battery (not shown in this Figure); a reduction mechanism 202 for transmitting the torque by the electric power, namely auxiliary torque, to the power transmission mechanism 300; and a control unit 250 for controlling an electric current to be supplied to the motor 201. The control unit 250 controls the electric current to the motor 201 in order to adjust the auxiliary torque so as to match with the torque detected by the torque detection means 102, as will be described later.

An input interface 251 is a circuit for inputting torque information indicating the largeness of the torque by human power from the torque detection means 102. A torque-calculation means 252 carries out a predetermined calculation on the basis of the torque information to figure out torque data indicating the auxiliary torque which should be generated by the motor 201. A target-current-value-calculation means 253 calculates a target current value, i.e., the above auxiliary torque, on the basis of the torque data obtained by the torque-calculation means 252 and velocity data detected by the velocity detection means 400.

Another interface 255 is a circuit for inputting a current information based on a detection signal from a current detection means 203, the current actually flowing in the motor 201. A deviation-calculation means 256 calculates a difference between the target current value and the actually flowing current value. A control-value-calculation means 257 calculates a controlling data which is necessary for adjusting this difference to zero. In case of the PWM control carried out in this embodiment, the controlling data is a compensation data for the duty factor of a pulse to be supplied to the motor 201. An output adjusting means 258 controls the current to be supplied to the motor 201 based on the above controlling data.

With such a construction, the torque, given by treading the pedals 101 by the rider's felet, is detected by the torque detection means 202. Then, the auxiliary torque, which is appropriate to the human-originated torque, is calculated by the torque-calculation means 252. In addition, the target current value, which is necessary for adjusting the auxiliary torque, is calculated by the target-current-value-calculation means 253, and the target current value is provided to the deviation-calculation means 256.

Additionally, a negative return control is carried out by a closed loop constituted of the deviation-calculation means 256, the control-value-calculation means 257, the output adjusting means 258, the current detection means 203, the input interface 255, and the deviation-calculation means 256. By this negative return control, the current to the motor 201 is adjusted to coincide with the target current value.

A construction of the vicinity of the motor 201 will now be described with reference to FIG. 2. As shown in this illustration, an N-channel type FET 206, the coil of the motor 201, and a shunt 203a are connected in series between positive and negative electrodes of the battery EB. The FET 206 controls the current supply to the motor 201. A diode 201a is arranged in parallel to the motor 201 and the shunt 203a. Therefore, immediately after the FET 206 is turned off, the current, which has previously flown through the motor 201, flows, by virtue of the diode 201a, through a circulation circuit formed by the diode 201a, motor 201, and shunt 203a, in the counterclockwise direction in the drawing. That is, the diode 201a functions as a flywheel diode.

Through the shunt 203a, the current flowing to the motor 201 also flows. This current corresponds to the auxiliary torque generated by the motor 201. When the FET 206 is off, this current contains the above-mentioned current by the diode 201a. The voltage drop, occurring between the terminals of the shunt 203a, is input to a differential amplifier 203b to be amplified. The amplified voltage drop is smoothed by a low-pass filter 203c. Accordingly, a means for detecting the motor current comprises the shunt 203a, the differential amplifier 203b, and the low-pass filter 203c. The voltage signal, indicating the average value of the current flowing to the motor 201, is supplied to the control unit 250.

A bootstrap circuit 204 and a gate drive 205 form an output adjusting means 258 (in FIG. 1) for the FET 206, the output adjusting means turning on and off the FET 206 in accordance with the pulse for the PWM control from the control unit 250. The reason for the provision of those circuits are as follows.

In this embodiment, since the shunt 203a is provided at the low potential side of the motor 201, the switching element or FET 206 is interposed between the motor 206 and the positive electrode of the battery EB. Accordingly, the source of the FET is not directly grounded as shown in FIG. 2, so that the source potential of the FET 206 fluctuates depending on the revolution condition of the motor 201. Thus, in order to stabilize the on-resistance of the FET 206, it is necessary to always apply a constant bias voltage between the gate and the source of the FET 206 in despite of the fluctuation of the source potential when the FET 206 is turned on. The bootstrap circuit 204 and the gate drive 205 are provided to meet the above-mentioned need.

The bootstrap circuit 204 comprises a voltage lowering circuit 204a, a diode 204b, and a capacitor 204c. The voltage lowering circuit 204a receives the DC voltage at 24V supplied from the battery EB and outputs the DC voltage at 12V. The diode 204b is connected at its anode to an output end of the voltage lowering circuit 204a, and at its cathode to the drive circuit 205. The capacitor 204c is connected at its one terminal to the cathode of the diode 204b, and at its other terminal to the source of the FET 206. With such a construction, the capacitor 204c is charged by the voltage lowering circuit 204a through the diode 204b, and always stores electric charge at a constant voltage since the capacitor 204c does not discharges the stored charge. The gate drive 205 adds the cathode voltage of the diode 204b to the pulse for the PWM control from the control unit 250, and provides the adjusted pulse to the source of the FET 206, the cathode voltage meaning the difference between the voltages at both the terminals of the capacitor 204c.

A relay 210 is interposed between the source of the FET 206 and the motor 201. This relay 210 is a normally open type, which interconnects the circuits when the exciting coil thereof is provided with a current and breaks the circuits when the supply of current is stopped. An exciting current is supplied to the exciting coil of the relay 210 and is stopped under the control of the control unit 250. The control unit 250 is actuated by electric current from the battery EB. A main switch 220 is interposed between the control unit 250 and the battery EB. When the main switch 220 is turned off, the control unit 250 detects the drop of the main voltage, and then, executes a procedure for stopping the control. That is, once the voltage drop is detected, the control unit 250 controls to stop the current supply to the exciting coil of the relay 210. It should be noted that the control unit 250 can be operated, for a short period after the current supply from the battery EB is stopped, by means of the electric charge stored in a capacitor or the like inside the control unit 250.

A-2. Operation of First Embodiment

Operation of the control device for the DC motor according to the first embodiment will now be described with reference to FIG. 3 and so on. FIG. 3 is a flowchart showing the procedures to be executed in case that the main switch 220 is turned on when the auxiliary torque is output during traveling of the auxiliary motor-equipped bicycle.

Turning-off of the main switch 220 does not result in immediate stop of the motor 201 because of the inertia thereof, and the motor 201 functions as a dynamo-electric generator. Accordingly, an induced voltage Vφ, oriented in the direction as indicated by the arrow of FIG. 2, is generated between the terminals of the FET 206. However, immediately after the FET 206 is turned off, the current, which has previously flown through the motor 201, flows, by virtue of the diode 201a, in the counterclockwise direction in FIG. 2, so that a forward voltage is applied between the gate and the source of the FET 206. Accordingly, no problem will occur even if the induced voltage Vφ is applied backward.

However, the circulating current is quickly reduced, whereas the revolution of the motor is continued for a longer period, so as to generate the induced voltage Vφ. Accordingly, after the circulating current disappears, the induced voltage Vφ is applied between the gate and source of the FET 206 as it is. Conventionally, since the allowable backward voltage for the FET 206 is lower than the rated forward voltage, there was the likelihood that the FET 206 is broken when the backward induced voltage Vφ is applied between the gate and the source of the FET 206.

In the control device of this embodiment, the control unit 250 watches, at step S1, whether or not the main switch 220 is turned off. That is, when the voltage supplied from the battery EB becomes at or below a predetermined level, the routine proceeds to step S2, and a timer (not shown) is started to count. Then, at step S3, a decision is made as to whether or not the timer count reaches a predetermined value. If the decision is NO, the routine proceeds to step S4, and the target-current-value-calculation means 253 sets the target current value to "b". This target current value "b" is a very small amount of current which does not contribute to rotate the motor 201.

Next, a negative return control is carried out with respect to the motor current by the closed loop constituted of the deviation-calculation means 256, the control-value-calculation means 257, the output adjusting means 258, the current detection means 203, the input interface 255, and the deviation-calculation means 256. The PWM control is renewed, at step S5, so as to be continued concurrently with the negative return control. Therefore, the electric current supplied to the motor 201 is adjusted to be equal to the target current value "b". Since the FET 206 is turned on every cycle of the pulse by virtue of the continuation of the PWM control, the circulating current continuously flows. Therefore, it is prevented that the induced voltage Vφ is applied directly between the gate and the source of the FET 206, whereby the FET 206 is protected. Thereafter, the routine is repeated from steps S1 to S5 until the timer count reaches the predetermined time.

When the timer count reaches the predetermined value, the decision at step S3 becomes YES, and then, the routine proceeds to step S6 where the target current value is set to zero. After that, the FET 206 is switched off, so that the PWM control for the motor 201 is stopped. If the main switch 220 is still not in its off-state, the routine proceeds from step S1 to step S7, and reset the timer to zero, whereby the normal PWM control is carried out. That is, in order to generate the auxiliary torque for supplementing the actual pedaling force, the target current value is calculated and the calculated current is supplied to the motor 201 (see steps S8 and S5).

In the above-described control device, a very small target current value "b" is set although the main switch 220 is turned off, and the current of this very small value is supplied to the motor 201. Accordingly, the circulating current flows to the motor 201, so that the induced voltage is canceled by the circulating current, and the FET 206 is surely prevented from being broken. Furthermore, the control device can be simply made by only setting the very small value "b" as the target current value in the control unit 250. Thus, change of design of the control device is minimized or omitted by change of software.

Especially, in the above embodiment, the target current value "b" is supplied to the DC motor until the passage of the predetermined time after the main switch 220 is turned off. The target value becomes zero after the passage of the predetermined time, so that the FET 206 is completely deactivated. However, since the target current, which has flown to the motor 201, is too small to contribute to the rotation of the motor 201, the number of revolution of the DC motor can be lowered to the sufficient extent until the passage of the predetermined time. Therefore, although the FET is completely off, the induced voltage Vφ is almost not applied between the source and the drain of the FET 206. Accordingly, the FET 206 is protected although the main switch 220 is turned off. The very small current is stopped to flow to the motor 201 after the passage of the predetermined time, whereby power consumption is saved.

B. Second Embodiment

A second embodiment of the present invention will now be described with reference to FIG. 4. This embodiment is characterized in that the current supply of the very small value "b" is stopped by the natural stop of the controller 250. That is, after the current supply to the controller 250 is stopped, the controller 250 is still operated for a short period to continue to supply the electric current having the very small current value "b" (see steps S10 through S12). However, when the electric power stored in the controller 250 is fully discharged, the controlling functions are all stopped. Accordingly, the setting of the very small current value "b", at step S11, is not carried out any more, and the current supply to the motor 201 is also stopped. In this embodiment, the ordinary PWM control is continued as long as the main switch is not turned off.

The second embodiment can achieve advantages identical to those of the first embodiment. In addition, since the second embodiment do not need timers, the construction of its hardware is more simplified and the construction of the software can also be simple.

C. Third Embodiment

C-1. Construction of Third Embodiment

Figure 5:
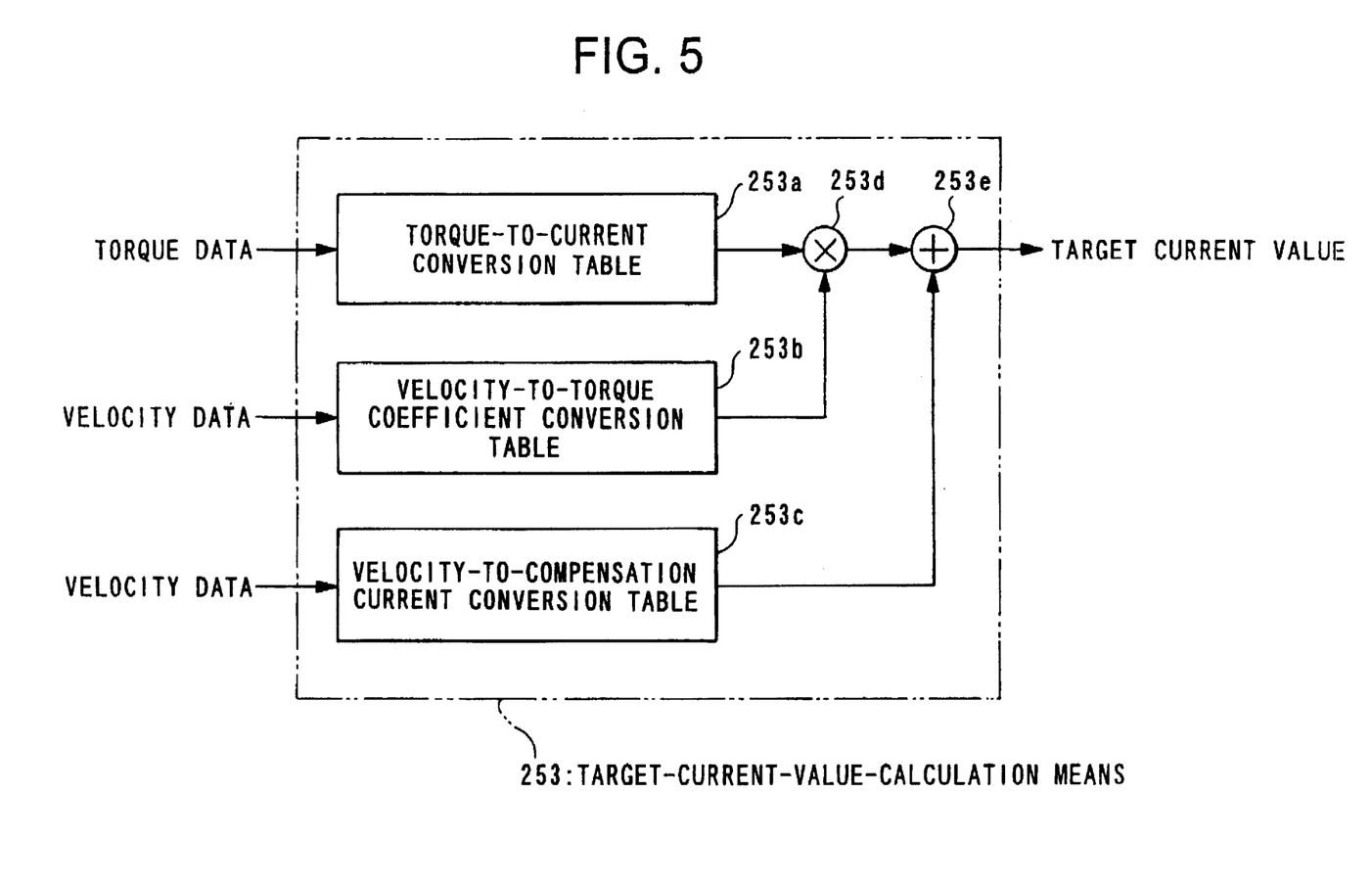
FIG. 5 is a view showing a construction of target-current-value-calculation means, in an overall construction of an auxiliary motor-equipped bicycle to which a third embodiment of the present invention is applied.

A construction of a third embodiment of the present invention will now be described with reference to the drawings. The construction of this third embodiment is such that in the block diagram of the auxiliary motor-equipped bicycle of FIG. 1, the target-current-value-calculation means 253 is constructed as shown in FIG. 5. The other structural elements are the same as those of the first and second embodiments.

In FIG. 5, a torque-to-current conversion table 253a converts torque data calculated by the torque-calculation means 252 to data indicating the current value for generating the auxiliary torque. Accordingly, the motor 201 generates the auxiliary torque which is suitable to the actual pedaling torque.

Figure 6A:
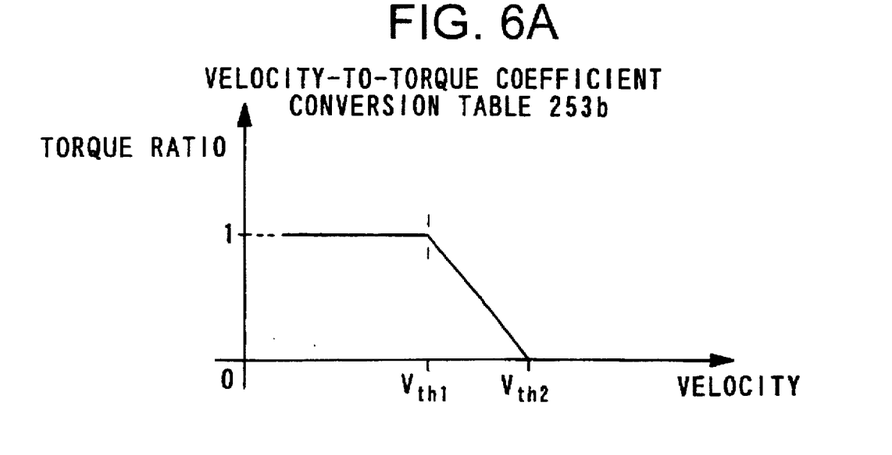

A velocity-to-torque coefficient conversion table 253b converts the velocity detected by the velocity detection means 400 to a torque ratio. The torque coefficient is the ratio of the auxiliary torque transmitted to the rear wheel to the generated auxiliary torque. The velocity-to-torque coefficient conversion table 253b is redrawn in the graph shown in FIG. 6 (a). As shown in this graph, according to the velocity-to-torque coefficient conversion table 253b, when the velocity is lower than the first threshold velocity Vth1, the torque coefficient is prescribed one. When the velocity is between the first threshold velocity Vth1 and the second threshold velocity Vth2, the torque coefficient is linearly reduced from one to zero. When the velocity is equal to or higher than the second threshold velocity Vth2, the torque coefficient is prescribed zero.

Figure 6B:
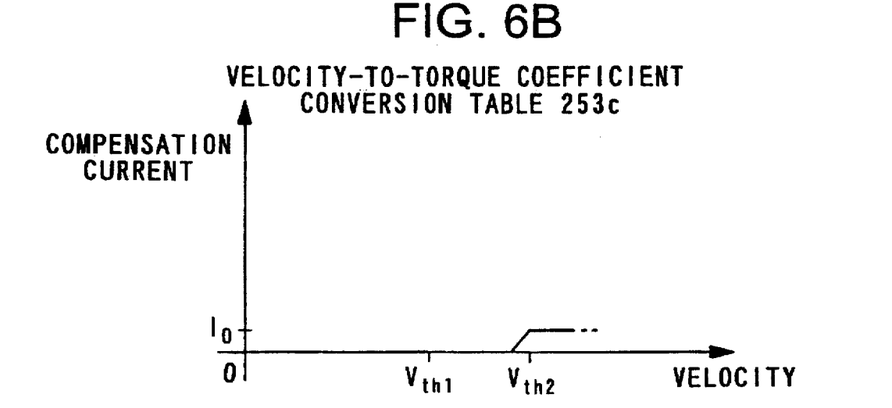

A velocity-to-compensation current conversion table 253c converts the velocity to a compensation current, which will be added to the current for generating the auxiliary torque for a predetermined period, so that the target current value does not become zero. The velocity-to-compensation current conversion table 253c is redrawn in the graph shown in FIG. 6 (b). In accordance with the velocity-to-compensation current conversion table 253c, when the velocity is slightly below the second threshold velocity Vth2, the compensation current is slightly generated, and when the velocity is equal to or higher than the second threshold velocity Vth2, the compensation current becomes to a constant value $i_0$. This compensation current $i_0$ is so small that although it is supplied to the motor 201, no auxiliary torque will be generated.

Furthermore, the velocity-to-compensation current conversion table 253c stops to supply this compensation current $i_0$ after the passage of a certain time period, for example, about two seconds from the beginning of the output of the constant compensation current $i_0$. This certain time period coincides the time for decelerate the revolution of the motor 201 to a small rotational speed in case of only the compensation current $i_0$ is supplied to the motor 201.

A multiplier 253d multiplies the torque coefficient, obtained by the velocity-to-torque coefficient conversion table 253b, by the current data, converted by the torque-to-current conversion table 253a. An adder 253e adds the multiplication result by the multiplier 253d to the compensation current by the velocity-to-compensation current conversion table 253c. The output from the adder 253e is output as the target current value.

C-2. Operation of Third Embodiment

The operation of the third embodiment will now be described with reference to FIGS. 6 (a) to (c). As previously discussed, in the auxiliary motor-equipped bicycle, the auxiliary torque caused by the motor 201 is generated depending on the actual pedaling force. However, for easy explanation, it is assumed that the auxiliary torque is constant in the following.

First, when the velocity is lower than the first threshold velocity Vth1, the torque coefficient by the velocity-to-torque coefficient conversion table 253b is one as shown in FIG. 6 (a). Accordingly, the target current value $i_a$, as it is, is supplied to the motor 201.

Figure 6C:
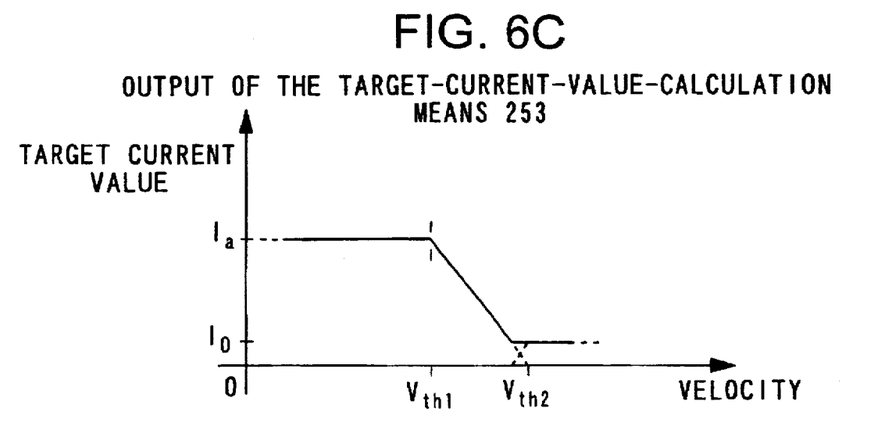

Next, when the velocity is between the first threshold velocity Vth1 and the second threshold velocity Vth2, the torque coefficient output by the velocity-to-torque coefficient conversion table 253b varies depending on the velocity as shown in FIG. 6 (a). That is, according to the increase of the velocity above the first threshold velocity Vth1, the ratio of the auxiliary torque to the pedaling force is gradually reduced. When the velocity is the second threshold velocity Vth2, the ratio becomes zero. However, when the velocity becomes slightly lower than the second threshold velocity Vth2, in accordance with the velocity-to-compensation current conversion table 253c, the auxiliary current is commenced to be provided, so that the target current value does not become zero. In other words, the target current value is at least the compensation current $i_0$ (FIG. 6 (b)). Furthermore, when the multiplication result by the multiplier 253d is zero (since the velocity rises to be equal to or higher than the second threshold velocity Vth2), the target current value is also maintained to be at least the compensation current value $i_0$ (see FIG. 6 (c)).

Accordingly, the control unit 250 continues the PWM control, so that the compensation current $i_0$ flows to the motor 201. Since the FET 206 is turned on periodically by the PWM control, the circulating current continuously flows so as to prevent the source of the FET from the direct application of the induced voltage, the FET 206 is being protected. However, the compensation current $i_0$ flowing at this stage does not contribute to generate the auxiliary torque, and is thus wasteful.

Therefore, in this embodiment, after the compensation current $i_0$ is output for a predetermined period since the velocity reaches the second threshold velocity, the supply of the compensation current $i_0$ is completely stopped in accordance with the velocity-to-compensation current conversion table 253c. Consequently, only the compensation current $i_0$ flows to the motor 201, and thus, the rotational speed of the motor 201 is lowered, although the motor 201 has previously rotated for driving the bicycle at the second threshold velocity Vth2. The velocity-to-compensation current conversion table 253c is previously prepared on the basis of the deceleration of the motor 201. Therefore, although the FET 206 is completely off, the revolution of the motor 201 is too slow to generate high induced voltage. Accordingly, although the circulating current is disappeared, the FET 206 is protected.

According to the third embodiment, it is possible to protect the FET 206 with an extremely small number of structural elements in comparison with conventional techniques. Furthermore, since the target-current-value-calculation means 253, which is the most important point of this embodiment, can be prepared by software, the hardware is almost not necessary to be changed.

D. Modifications or Alternations

Although various features of the present invention have been described with reference to the accompanying drawings, it is to be understood that the invention is not limited to the foregoing description and the various modifications may be made in the invention as follows.

(1) In the first and second embodiments, the off-state of the main switch 220 is detected by the measurement of the drop of the power supply (battery EB). Instead, the state of the main switch 220 may be detected by electrical or mechanical instrument.

(2) In the first through third embodiments, other switching means, for example, other transistors may be used instead of the FET.

(3) In the third embodiment, even if the velocity is lower than the first threshold velocity Vth1, when the pedaling force is suddenly stopped, it may occur that the induced voltage becomes high since a strong auxiliary torque is generated. This phenomenon will occur if the first threshold velocity Vth1 is determined higher. To avoid this, it is possible that the velocity-to-compensation current conversion table 253c refers not only to the velocity, but also to the output of the torque-to-current conversion table 253c for providing the compensated voltage.

Figure 3:
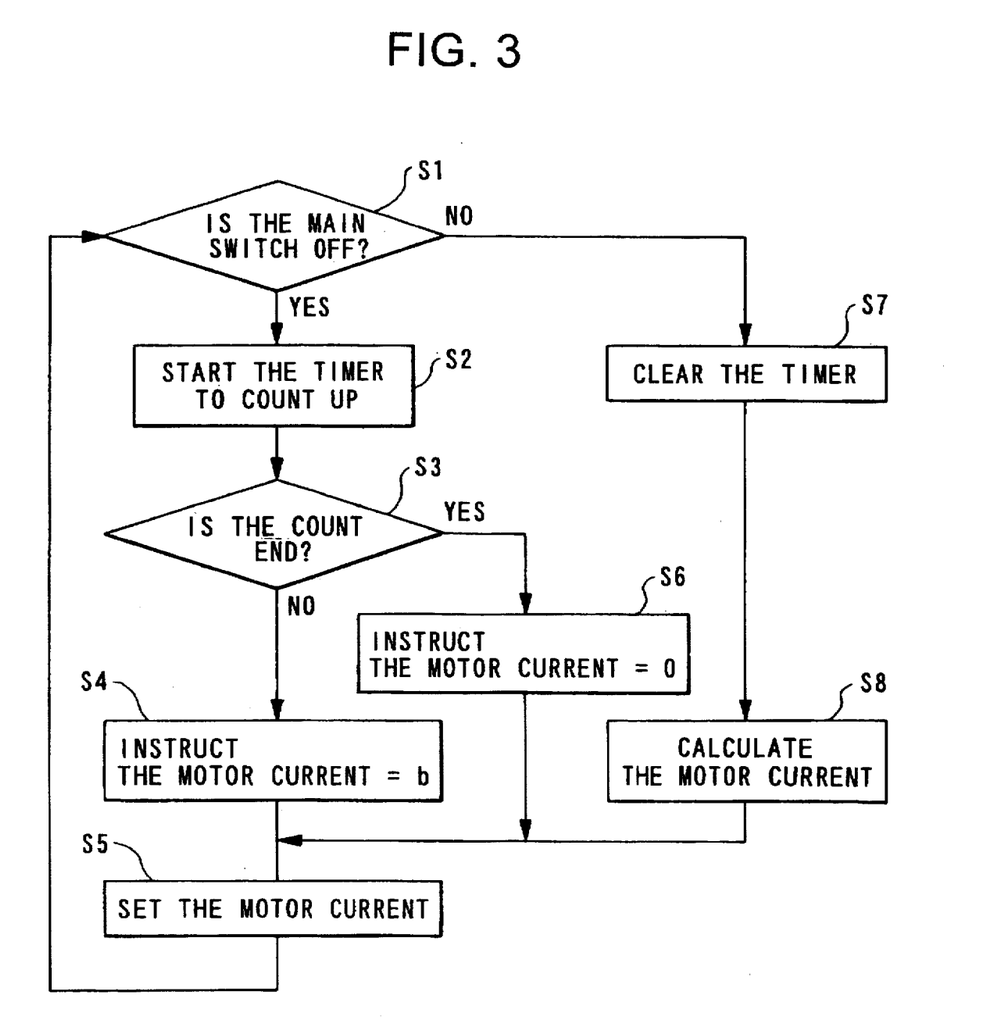
FIG. 3 is a flowchart showing the operation of the first embodiment.
Figure 4:
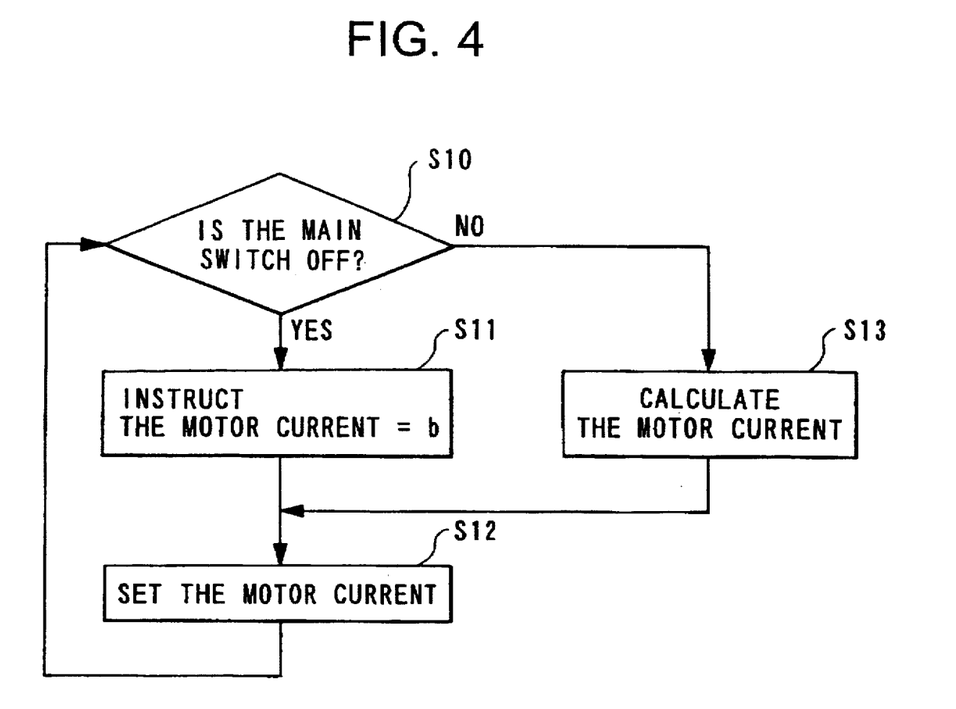
FIG. 4 is a flowchart showing the operation of a second embodiment of the present invention.

(4) In the third embodiment, the period for outputting the compensation current $i_0$ after the velocity is in excess of the second threshold velocity Vth2 may be obtained, as in the first or second embodiment, by carrying out the procedures shown in the flowcharts of FIG. 3 or 4.

Figure 2:
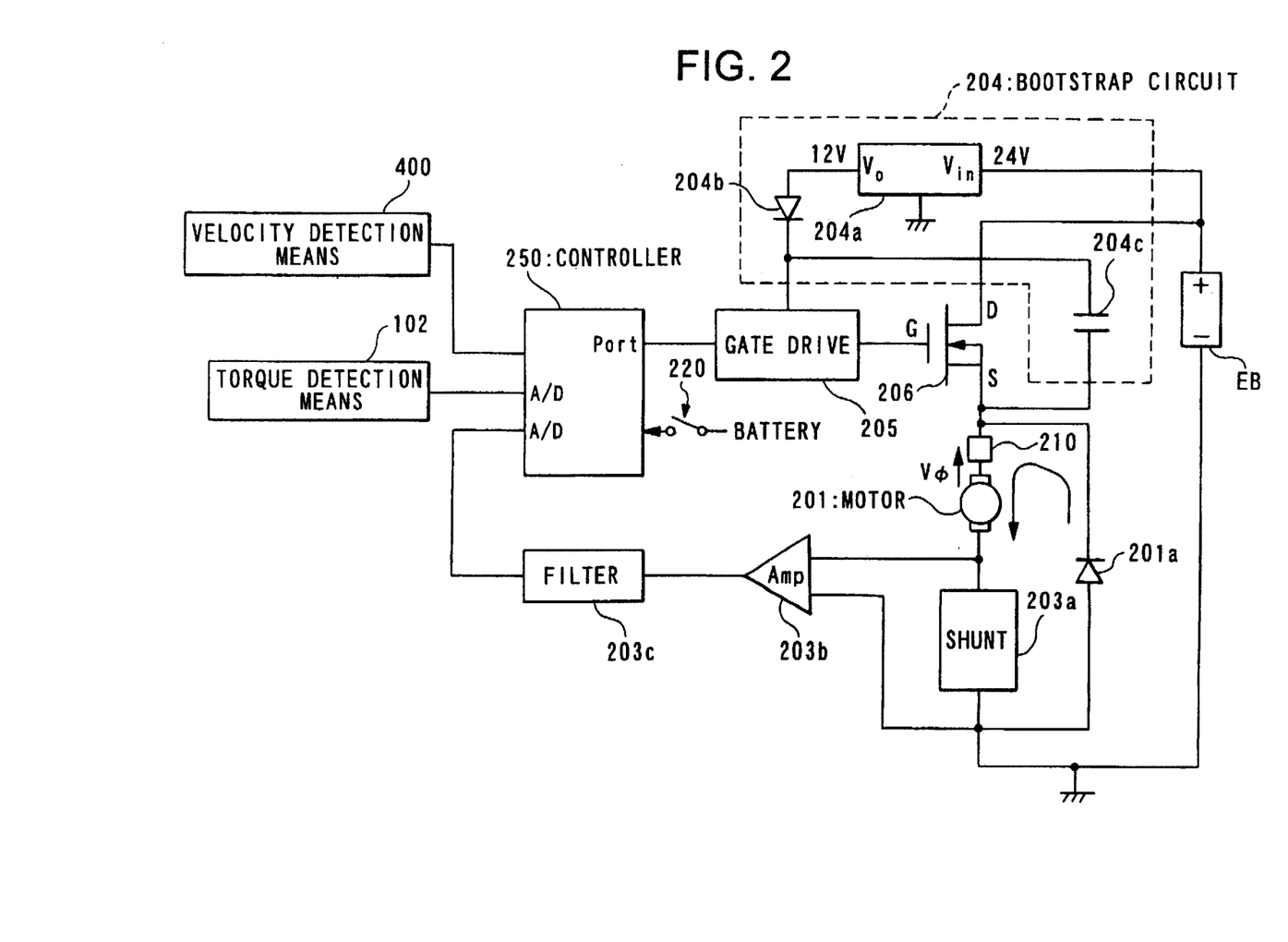
FIG. 2 is a diagram showing a circuit configuration of the vicinity of the motor of the auxiliary motor-equipped bicycle according to the first embodiment.
Figure 7:
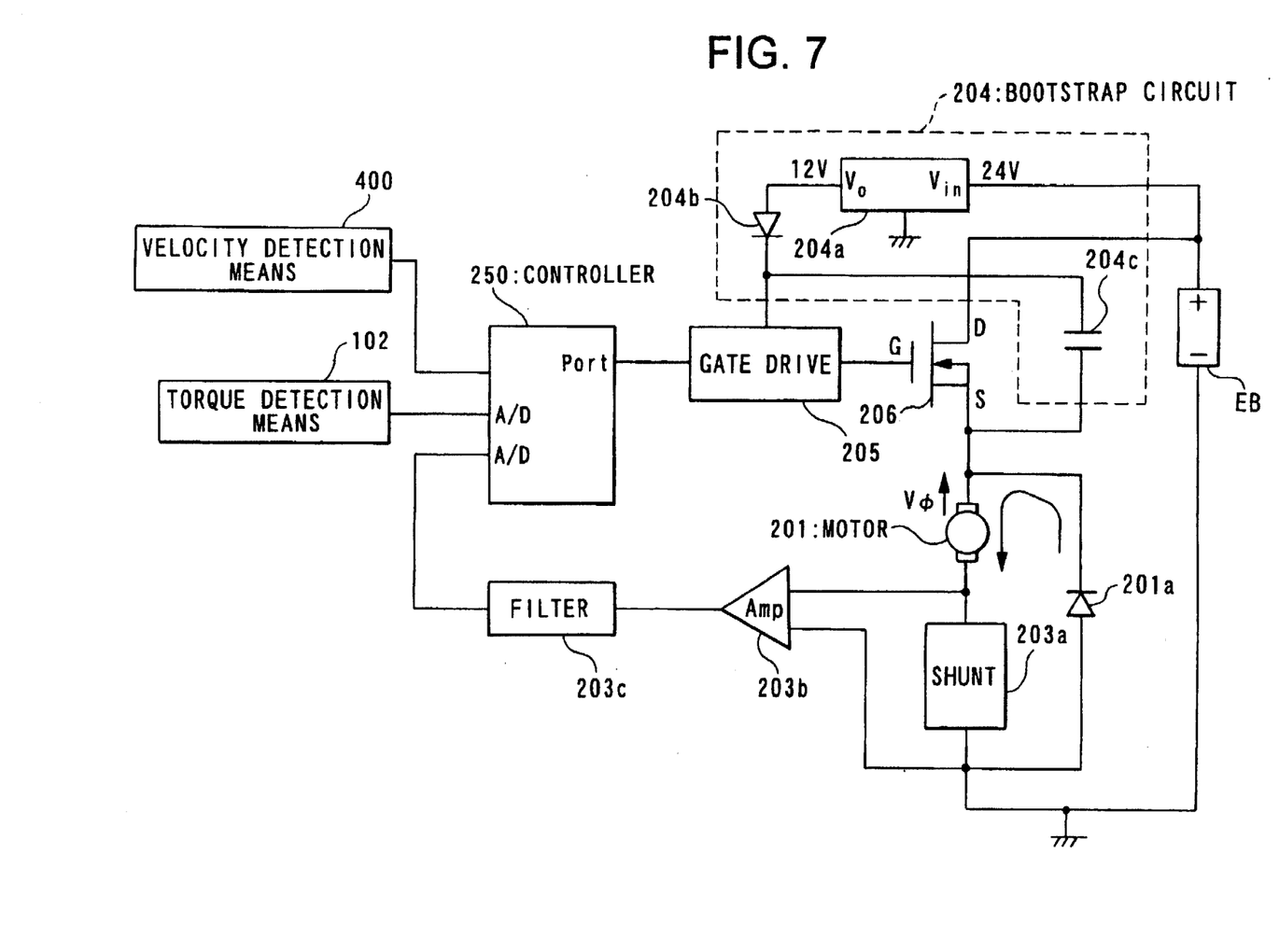
FIG. 7 is a diagram showing a circuit configuration of the vicinity of the motor of the auxiliary motor-equipped bicycle according to a modified embodiment.

(5) In the third embodiment, the relay 210 may be eliminated from the circuit configuration in the vicinity of the motor in FIG. 2. The circuit configuration in the vicinity of the motor in this case is shown in FIG. 7.

E. Advantageous Effect

As described hereinbefore, according to the present invention, the following advantageous effects can be achieved. That is, according to the invention as defined in claim 1, when a DC electric motor is rotated by the inertia thereof, the switching means can surely be protected at a low cost. Especially, although the switch of the power supply is turned off or the target value is set to zero, the small amount of electric current is supplied to the DC electric motor, so that the switching means can be protected surely (claims 2 and 3). Furthermore, according to the invention as defined in claim 4, not only the protection of the switching means, but also saving of the electric force can be accomplished.

Industrial Applicability

The present invention is preferable for controlling a direct current electric motor such as an auxiliary motor for driving a bicycle. Likewise, the invention may be suitably applied for protecting a switching means used for PWM control.

We claim:

1. A control device for a direct current electric motor comprising:

switching means interposed between a direct current electric motor and an electric power source therefor;

circulation means for circulating an electric current so as to flow through the motor after the switching means is off, the electric current is the same as that which has flown through the motor before the switching means is on;

current detection means for detecting a value of the electric current flowing to the motor; and controlling means for turning on and off the switching means by the PWM control, so that the value of the electric current detected by the current detection means coincides with a target value, the controlling means setting a very small value as the target value when the motor is rotated by inertia thereof, and supplying the electric current of the small target value to the motor.

2. A control device for a direct current electric motor according to claim 1, wherein the controlling means sets a vary small value as the target value when a switch of the power supply is turned off, and supplies the electric current of the small target value to the motor.

3. A control device for a direct current electric motor according to claim 1, wherein the controlling means sets a very small value as the target value before setting the target value zero, and supplies the electric current of the very small value to the motor.

4. A control device for a direct current electric motor according to one of claims 1 through 3, wherein the controlling means sets the very small value to zero after passage of a predetermined time from the time when the supply of the electric current of the very small value is started.

* * * * *